United States Patent
Kukita et al.

(10) Patent No.: US 11,287,399 B2
(45) Date of Patent: Mar. 29, 2022

(54) SENSING DEVICE

(71) Applicants: NIHON DEMPA KOGYO CO., LTD., Tokyo (JP); JAPAN AEROSPACE EXPLORATION AGENCY, Tokyo (JP)

(72) Inventors: Hiroyuki Kukita, Saitama (JP); Tsuyoshi Shiobara, Saitama (JP); Yuki Yanagisawa, Saitama (JP); Shohei Nakagawa, Saitama (JP); Eiji Miyazaki, Tokyo (JP); Yuta Tsuchiya, Tokyo (JP)

(73) Assignees: NIHON DEMPA KOGYO CO., LTD., Tokyo (JP); JAPAN AEROSPACE EXPLORATION AGENCY, Tokyo (JP)

( * ) Notice: Subject to any disclaimer, the term of this patent is extended or adjusted under 35 U.S.C. 154(b) by 141 days.

(21) Appl. No.: 16/882,757

(22) Filed: May 26, 2020

(65) Prior Publication Data
US 2020/0378924 A1    Dec. 3, 2020

(30) Foreign Application Priority Data
May 27, 2019   (JP) .............................. JP2019-098699

(51) Int. Cl.
*G01N 29/22*    (2006.01)
*G01N 29/02*    (2006.01)
(Continued)

(52) U.S. Cl.
CPC ......... *G01N 29/022* (2013.01); *G01N 29/036* (2013.01); *G01N 29/32* (2013.01);
(Continued)

(58) Field of Classification Search
CPC .. G01H 11/08; G01H 13/00; G01N 2291/014; G01N 2291/021;
(Continued)

(56) References Cited

U.S. PATENT DOCUMENTS 5,579,205 A * 11/1996 Tustaniwskyj ...... H01L 23/4093
                                                  24/545
6,449,154 B1 * 9/2002 Yoneyama .......... H01L 23/4093
                                                  165/80.3

(Continued)

FOREIGN PATENT DOCUMENTS

JP    2005257394    9/2005
WO    2018087957    5/2018

OTHER PUBLICATIONS

"Search Report of Europe Counterpart Application", dated Oct. 6, 2020, p. 1-p. 8.

*Primary Examiner* — Francis C Gray
(74) *Attorney, Agent, or Firm* — JCIPRNET

(57) ABSTRACT

A sensing device that senses a substance to be sensed as a gas by causing a piezoelectric resonator to adsorb the substance to be sensed, includes: a substrate, a thermoelectric element unit, a support plate, and a base portion. A sensing module unit in which a substrate, a thermoelectric element unit, and a support plate are integrated is removably disposed to a base portion that performs at least one of heat supply and heat dissipation to the thermoelectric element unit.

10 Claims, 4 Drawing Sheets

(51) Int. Cl.
  *G01N 29/036* (2006.01)
  *G01N 29/32* (2006.01)
  *H01L 25/16* (2006.01)

(52) U.S. Cl.
  CPC . *G01N 2291/014* (2013.01); *G01N 2291/021* (2013.01); *H01L 25/162* (2013.01)

(58) Field of Classification Search
  CPC ... G01N 2291/0255; G01N 2291/0256; G01N 2291/0426; G01N 29/022; G01N 29/036; G01N 29/22; G01N 29/2437; G01N 29/32; G01N 29/326; H01L 25/162; H01L 35/00
  See application file for complete search history.

(56) References Cited

U.S. PATENT DOCUMENTS

| | | | |
|---|---|---|---|
| 9,625,420 B2* | 4/2017 | Kukita | G01N 29/022 |
| 10,302,623 B2* | 5/2019 | Kukita | G01N 29/022 |
| 10,620,199 B2* | 4/2020 | Shinobu | G01N 29/036 |
| 2010/0200206 A1 | 8/2010 | Mandrone et al. | |
| 2010/0322280 A1 | 12/2010 | Kwon et al. | |
| 2016/0211191 A1 | 7/2016 | Tan et al. | |
| 2020/0274493 A1* | 8/2020 | Yanagisawa | G01N 29/222 |

* cited by examiner

SENSING DEVICE

CROSS REFERENCE TO RELATED APPLICATIONS

This application claims the priority benefit of Japanese Patent Application No. 2019-098699, filed on May 27, 2019. The entirety of the above-mentioned patent application is hereby incorporated by reference herein and made a part of this specification.

TECHNICAL FIELD

Embodiments of the present invention relates to a sensing device that senses a substance to be sensed from a frequency change of a piezoelectric resonator.

BACKGROUND ART

As a sensing sensor that senses a material contained in a gas, there has been known a Quartz crystal microbalance (QCM) using a crystal resonator. As one of a method for sensing a material using the QCM, there has been known a method where, after a gas is adhered to a crystal resonator, the temperature of the crystal resonator is gradually increased from a low temperature state to desorb the gas adhered to the crystal resonator.

In this method, an adhesion amount of the gas is measured by measuring an amount of frequency variation before and after the gas desorption, and a component of the gas is specified by detecting the temperature at the gas desorption. For actively performing the temperature change of the crystal resonator described above, there has been known a device where a Peltier element is built-in, and a sensing device where the QCM and a temperature controlling means for removing the gas are used in combination is also referred to as a Thermoelectric QCM (TQCM).

In the TQCM, recently, for improving a measurement sensitivity, reducing variation in heating and cooling performances of the crystal resonator has been required. Even a TQCM that includes a temperature control unit, an oscillator circuit of the crystal resonator, and the like and has a complicated structure, a device configuration having high maintainability is preferable.

Patent Document 1 discloses the sensing sensor that has a configuration where a crystal resonator sensor, a Peltier element, and a heat transfer material are laminated in this order from above. However, the variation in heating and cooling performance of the crystal resonator and the maintenance of the device are not focused on, and a configuration to solve the problem of the present invention is not disclosed.

Patent Document 1: Japanese Patent Application Laid-Open (JP-A) No. 2005-257394

SUMMARY

Embodiments of the present invention have been made based on these circumstances, and provide a sensing device where maintenance is facilitated while variation in heating and cooling of a piezoelectric resonator is reduced.

A sensing device of an embodiment of the present invention is a sensing device that adsorbs a substance to be sensed as a gas to a piezoelectric resonator, changes a temperature of the piezoelectric resonator to desorb the substance to be sensed, and senses the substance to be sensed based on a relationship between a change of an oscillation frequency of the piezoelectric resonator and the temperature. The sensing device includes a substrate, a thermoelectric element unit, a support plate, and a base portion. The substrate holds the piezoelectric resonator. The thermoelectric element unit is disposed at a position in contact with the substrate to change the temperature of the piezoelectric resonator. The support plate supports the thermoelectric element unit from an opposite side of the position in contact with the substrate. The support plate is secured to the base portion such that a surface on an opposite side of the surface to support the thermoelectric element unit is in contact with the base portion. The base portion performs at least one of heat supply and heat dissipation to the thermoelectric element unit via the support plate. The substrate, the thermoelectric element unit, and the support plate are integrated to form a sensing module unit removable from the base portion.

The sensing device includes the sensing module unit where the substrate that holds the piezoelectric resonator, the thermoelectric element unit to change the temperature of the piezoelectric resonator, and the support plate that supports the thermoelectric element unit are integrally configured in advance. Furthermore, the sensing module unit is configured to be removable from the base portion that performs at least one of the heat supply and the heat dissipation to the thermoelectric element unit. Therefore, a variation in cooling and heating performance due to an assembling error in a case where the substrate and the thermoelectric element unit are individually combined to form the sensing device can be suppressed, and maintenance is facilitated.

DESCRIPTION OF EMBODIMENTS

Figure 1:
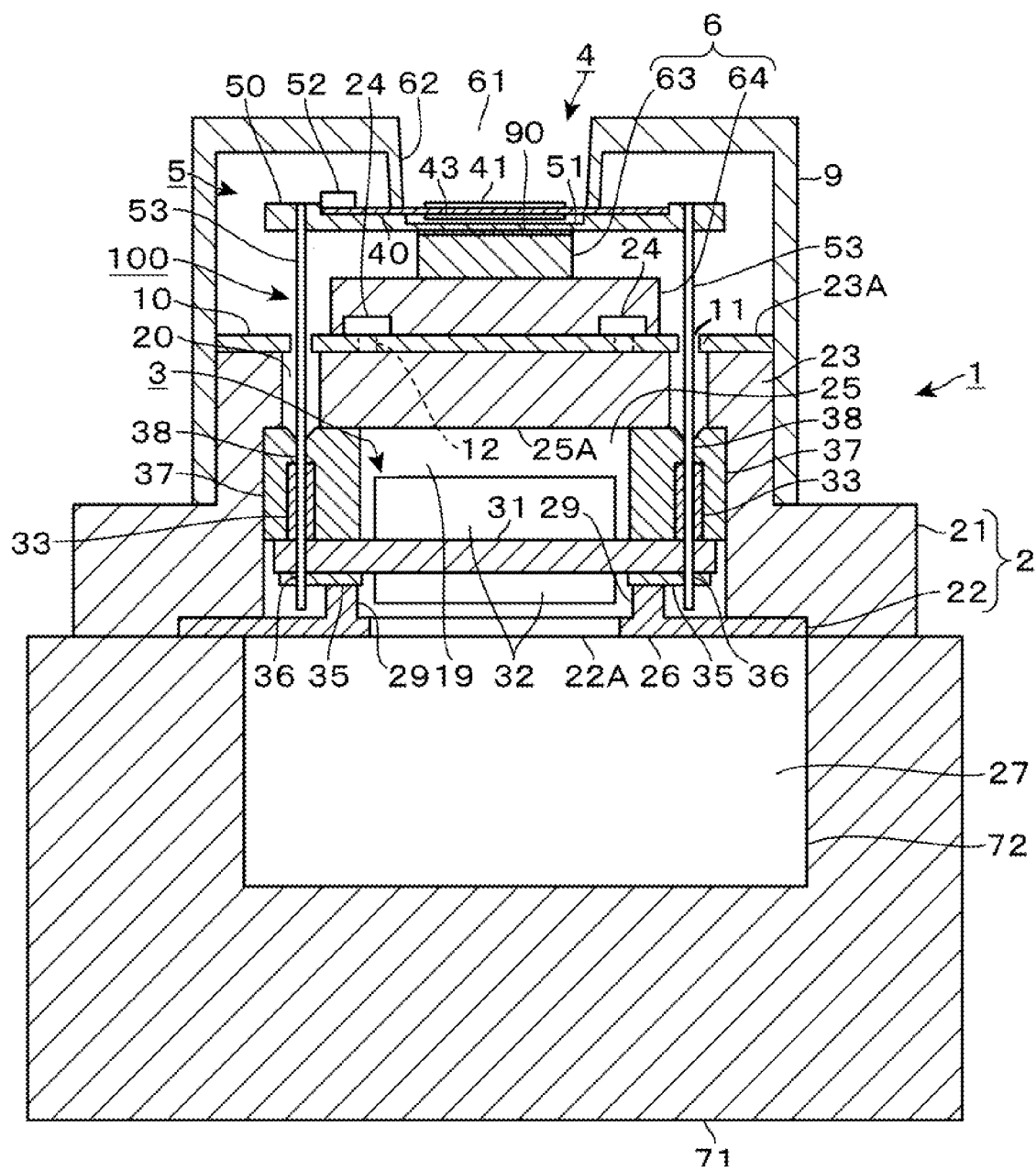
FIG. 1 is a longitudinal sectional side view of a sensing device according to an embodiment of the present invention.

A sensing device 1 that is a TQCM of one embodiment of the present invention will be described with reference to the longitudinal sectional side view of FIG. 1. The sensing device 1 includes a base portion 2, a circuit board 3, a crystal resonator 4, a Peltier element unit 6, and a cover 9. In this example, the crystal resonator 4 and the Peltier element unit 6 are configured as a sensor module 100, which is a sensing module unit. When an outline of a structure of the sensing device 1 will be described, the sensor module 100 and the cover 9 are each supported to the base portion 2, and the cover 9 covers the sensor module 100 on the base portion 2. The cover 9 is open at a position opposing the crystal resonator 4, and configured to supply a gas to the crystal resonator 4.

The circuit board 3 for oscillating the crystal resonator 4 is housed inside the base portion 2. This sensing device 1 is configured to change a temperature of the crystal resonator 4 by the Peltier element unit 6 in a range of, for example, −80° C. to +125° C. The base portion 2 is configured to output an oscillation frequency of the crystal resonator 4 to a device external to the sensing device 1, and configured to be connectable to a cooling unit 71 that dissipates a heat generated when the Peltier element unit 6 cools the crystal resonator 4.

The base portion 2 is formed of, for example, a nickel-plated copper, and includes a base main body 21 and a lid portion 22. The base main body 21 is configured as a block having a circular shape in plan view, and is, for example, integrally molded so as to provide a high heat transfer performance. The center portion of one surface side (upper surface side) of this base main body 21 projects to the one surface side and is configured as a protrusion portion 23 having a circular shape in plan view, and one surface of this protrusion portion 23 is configured as a flat surface 23A. The flat surface 23A includes two elongated holes 20 opening to be separated to right and left when viewing FIG. 1 in front. The elongated holes 20 extend in a direction perpendicular to the paper surface when viewing FIG. 1 in front. A depressed portion 19 is formed in the center portion of another surface side (lower surface side) of the base main body 21, and the elongated holes 20 open inside this depressed portion 19. Now, in the following description, unless otherwise noted, assume that the projection direction of the protrusion portion 23 is an upper direction, the arrangement direction of the two elongated holes 20 is a right-left direction, and a direction perpendicular to FIG. 1 is a front-back direction. However, these directions are attached for convenience of explanation, and the direction of the sensing device 1 in use is not limited to the directions illustrated here.

The lid portion 22 constituting the base portion 2 covers the depressed portion 19 from the lower side (one side) of the base main body 21 to form a sealed housing space 25 that houses the circuit board 3 and the like. The circuit board 3 includes a substrate 31 and respective integrated circuits 32 disposed in the center portion of an upper surface side and the center portion of a lower surface side of the substrate 31. The integrated circuit 32 is formed of a silicon semiconductor device, and includes an oscillator circuit connected to the crystal resonator 4 to oscillate the crystal resonator 4. On each of right and left end portions on the upper surface side of the substrate 31, a plurality of pipe-shaped sockets 33 extending in the up-down direction are disposed in an arrangement in the front-back direction. The sockets 33 are conductive, and equivalent to electrodes electrically connected to the respective integrated circuits 32.

Positions of the respective sockets 33 correspond to positions of pins 53 described below inserted into the sockets 33. On the substrate 31, holes are bored in a thickness direction so as to match the holes of the sockets 33, and the pins 53 inserted into the sockets 33 are configured to pass through the substrate 31. The substrate 31 is configured to be connected to one end of a cable (not illustrated), and the other end of the cable is extracted to a depressed portion 22A of a plate-shaped body 26 of the base portion 2 and connected to a connector (not illustrated) to be connected to an external main body.

Incidentally, the housing space 25 houses two spacers 35 and two guiding members 37 in addition to the circuit board 3. The spacers 35 and the guiding members 37 are heat insulating portions that suppress heat transfer from the base portion 2 to the circuit board 3, and formed of a material having a low heat conductivity, for example, Teflon (registered trademark). The spacers 35 are disposed downward the respective right and left end portions of the circuit board 3 (substrate 31), and the guiding members 37 are disposed upward the respective right and left end portions of the substrate 31. The guiding member 37 has a plurality of through holes 38 penetrating the guiding members 37 in the up-down direction, and the through holes 38 are arranged in the front-back direction. The above-described sockets 33 are inserted into the lower side of the through holes 38.

As described above, with the mutually secured base main body 21 and lid portion 22 of the base portion 2, the upper surface and the lower surface of the guiding member 37 are brought into close contact with a ceiling surface 25A of the housing space 25 and the upper surface of the substrate 31, respectively. The upper surface and the lower surface of the spacer 35 are brought into close contact with the lower surface of the substrate 31 and a supporting projection 29, respectively. Consequently, the right and left end portions of the substrate 31 are sandwiched by the guiding members 37 and the spacers 35. Accordingly, the respective positions of the guiding members 37, the spacers 35, and the substrate 31 in the housing space 25 are fixed. When the members are each fixed as described above, the integrated circuit 32 on the upper surface side of the substrate 31 separates from the ceiling surface 25A of the housing space 25, and the integrated circuit 32 on the lower surface side of the substrate 31 separates from the plate-shaped body 26 of the base portion 2.

Subsequently, the configuration of the sensor module 100 will be described with reference to also FIG. 2 enlarging the sensor module 100. The sensor module 100 includes a sensor unit 5 where the crystal resonator 4 is disposed, the Peltier element unit 6 that heats and cools the crystal resonator 4 to change a temperature, and a support plate 10 that supports the sensor unit 5 and the Peltier element unit 6 to attach to and remove from the base portion 2.

The sensor unit 5 includes a substrate 50, which holds the crystal resonator 4 and is formed of Low Temperature Co-fired Ceramics (LTCC), in the center portion. On an upper surface of the substrate 50, an approximately elliptical shaped depressed portion 51 that houses an excitation electrode 43 on the lower surface side of the crystal resonator 4 is formed, and a peripheral edge portion of the crystal resonator 4 is supported to an opening edge portion of this depressed portion 51. On the upper surface of the substrate 50, a temperature detector 52 to detect the temperature of the crystal resonator 4 is disposed. In the center portion of a lower surface of the substrate 50, a depressed shaped cavity 50a having a rectangular shape corresponding to a shape of an upper surface of a Peltier element 63 is formed for positioning the Peltier element unit 6 described below.

The crystal resonator 4 includes, for example, a circular plate-shaped crystal element 40 as an AT-cut piezoelectric piece. On an upper surface side and a lower surface side of the crystal element 40, excitation electrodes 41, 43 formed of gold (Au) are disposed, respectively. The excitation electrodes 41, 43 are disposed to mutually overlap sandwiching the crystal element 40. The peripheries of the excitation electrodes 41, 43 are partially extracted to edge portions of the crystal element 40 to form extraction electrodes (not illustrated).

The temperature detector 52 and the extraction electrodes extended from the respective excitation electrodes 41, 43 are electrically connected to upper end portions of the pins 53 as rod-shaped conductive members via a wiring pattern (not illustrated) formed on the substrate 50 and a conductive member (not illustrated) disposed on the substrate 50. A plurality of the pins 53 are disposed on each of the right and left end portions of the substrate 50, arranged in the front-back direction, penetrate the substrate 50, and extend long vertically below the substrate 50. In this embodiment, the pins 53 are configured to be removable from the extraction electrodes connected to the temperature detector 52 and the respective excitation electrodes 41, 43. Then, the pin 53 is inserted through the elongated hole 20 of the base portion 2, the through hole 38 of the guiding member 37, the hole of the socket 33, the hole of the substrate 31, and a hole 36 of the spacer 35 in this order. With the pin 53 insert into the socket 33, the socket 33 as the electrode connected to the circuit board 3 is electrically connected to the pin 53. Accordingly, the crystal resonator 4 and the temperature detector 52 in the sensor unit 5 are electrically connected to the circuit board 3. By pulling out the pin 53 from the socket 33, the sensor unit 5 side and the circuit board 3 are switched to a disconnected state.

The Peltier element unit 6 of this example includes two Peltier elements 63, 64 each formed in a rectangular shape, and has a configuration of upper and lower two stages where a lower surface of the Peltier element 63 and an upper surface of the Peltier element 64 are mutually closely adhered via a high thermal conductive adhesive and the like. The Peltier elements 63, 64 have upper surfaces and lower surfaces, among which one surfaces are heat dissipation surfaces (heating surfaces) and the other surfaces are cooling surfaces, and the heat dissipation surfaces and the cooling surfaces are mutually switched by switching a direction of a current supplied to the Peltier elements 63, 64, thereby ensuring performing the cooling and the heating of the sensor unit 5. When cooling the sensor unit 5, both the Peltier elements 63, 64 have the upper surfaces as the cooling surfaces and the lower surfaces as the heat dissipation surfaces. When heating the sensor unit 5, both the Peltier elements 63, 64 have the upper surfaces as the heat dissipation surfaces and the lower surfaces as the cooling surfaces. The upper surface of the Peltier element 64 on the lower stage side is formed to be larger than the lower surface of the Peltier element 63 on the upper stage side, and the lower surface of the Peltier element 63 is disposed in the center portion of the upper surface of the Peltier element 64. The Peltier element unit 6 equivalents to a thermoelectric element unit of this embodiment.

The support plate 10 is formed of a nickel plated copper plate in a circular plate shape, and in the center portion of an upper surface, a depressed shaped cavity 10a having a rectangular shape corresponding to a shape of the lower surface of the Peltier element 64 is formed for positioning the Peltier element unit 6. On the right and left of the cavity 10a, respective slits 11 through which the pins 53 pass are formed.

Furthermore, in a peripheral edge of the support plate 10 in front and back of the cavity 10a, two-hole portions 12 are each formed circumferentially separated, and screw members 24 to secure the sensor module 100 to the base portion 2 are inserted through the respective hole portions 12. The hole portions 12 are arranged so as to be positioned symmetrically in right and left with respect to a straight line that passes through the center portion of the support plate 10 and extends to front and back.

Figure 2:
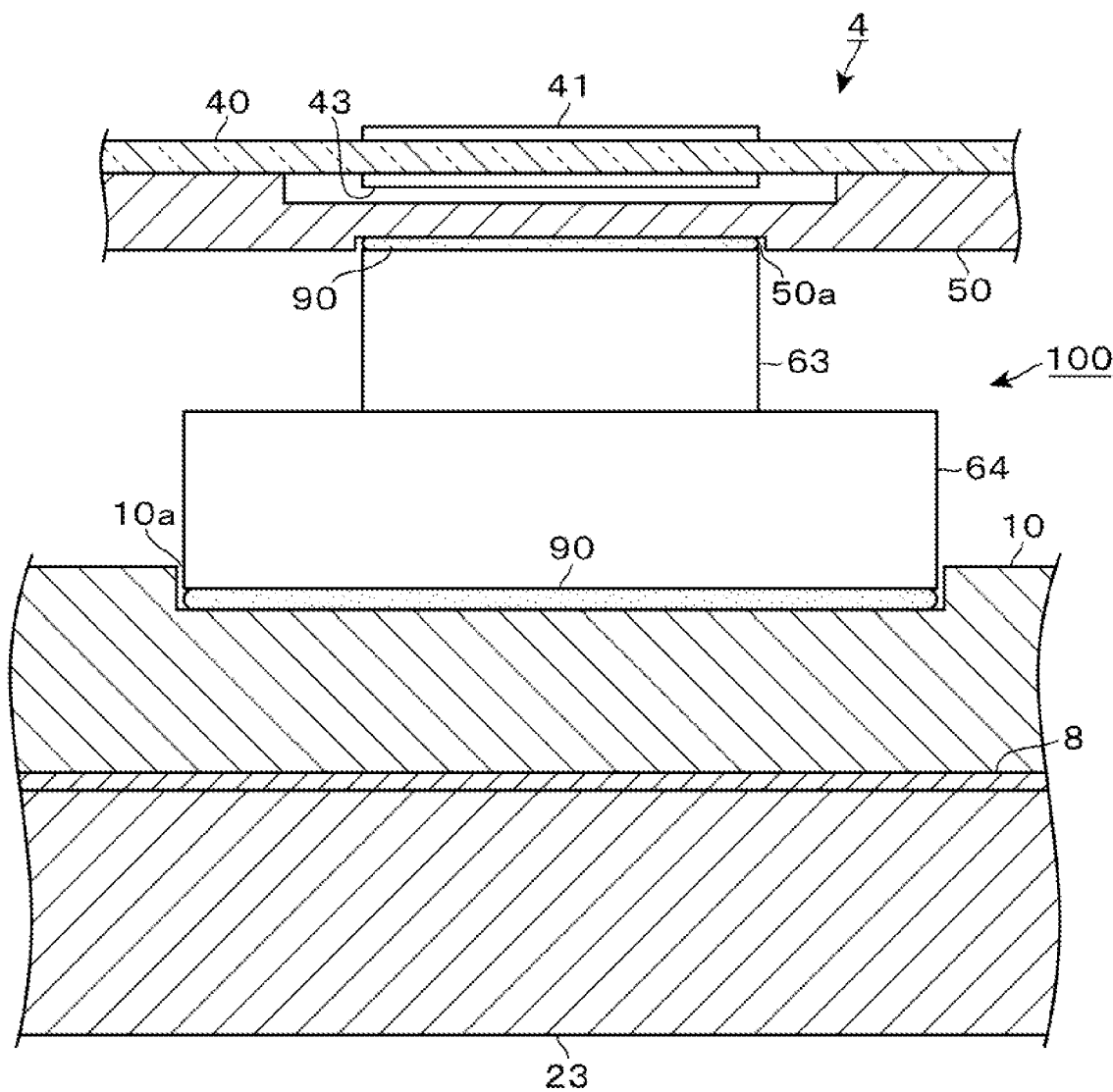
FIG. 2 is an enlarged longitudinal sectional side view of a part of the sensing device.

Then, as illustrated in FIG. 2, the upper surface of the Peltier element unit 6 is inserted into the cavity 50a on the lower surface of the sensor unit 5 to be positioned. The Peltier element unit 6 and the sensor unit 5 are secured by a metal nanoparticle paste 90, such as a silver nanoparticle paste. The lower surface of the Peltier element unit 6 is inserted into the cavity 10a on the upper surface of the support plate 10 to be positioned, and the Peltier element unit 6 and the support plate 10 are also secured by the metal nanoparticle paste 90 described above.

As described above, in the sensor module 100 of this example, the substrate 50, the Peltier element unit 6, and the support plate 10 are integrated via the metal nanoparticle paste 90. Note that, in this example, "integrated" for the sensor module 100 is satisfied only when the substrate 50, the Peltier element unit 6, and the support plate 10 are integrally mountable to and removable from the sensing device 1, and it is not an indispensable requirement that these members 50, 6, and 10 are adhesively secured to the extent that it is difficult to mutually separate them.

Since the upper surface and the lower surface of the Peltier element unit 6 are inserted into the cavities 50a, 10a formed on the sensor unit 5 and the support plate 10 to perform the positioning as described above, the connection portion of the sensor unit 5 and the Peltier element unit 6 and the connection portion of the Peltier element unit 6 and the support plate 10 can be said to each have a fitting structure where one is fitted to the other to perform the positioning.

Figure 3A:
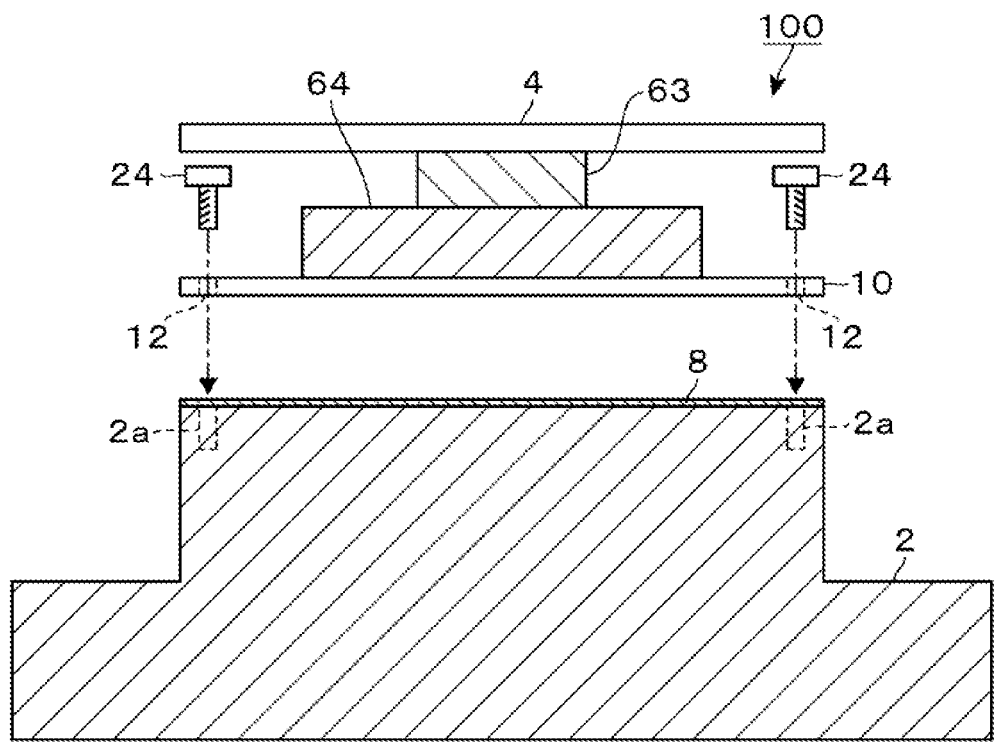
FIG. 3A and FIG. 3B are explanatory drawings illustrating attaching and removing a sensor module of the sensing device.
Figure 3B:
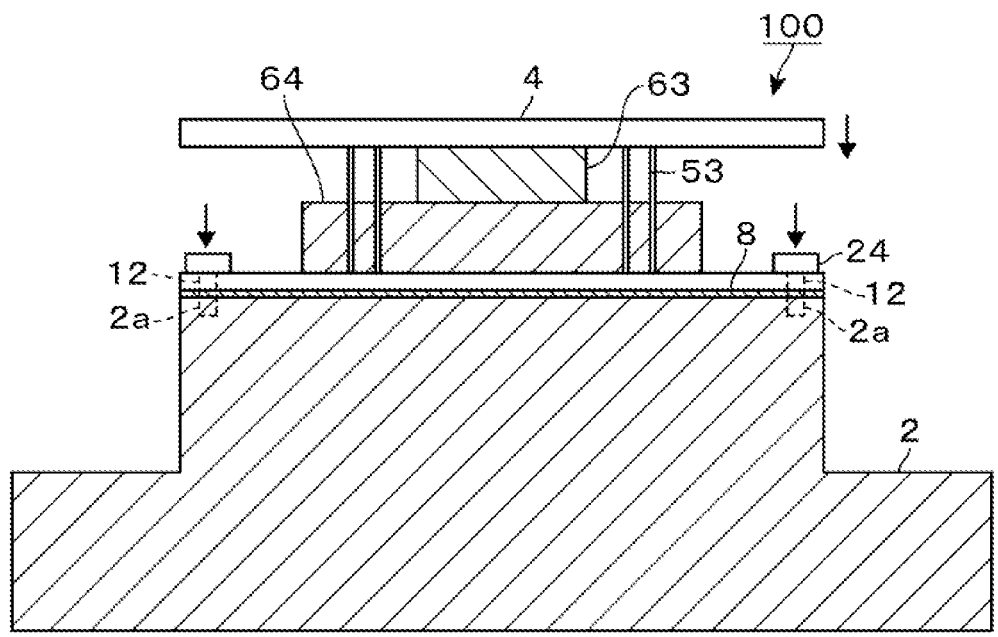

Attaching and removing the sensor module 100 that has the above-described configuration will be described with reference to FIG. 3A and FIG. 3B. FIG. 3A and FIG. 3B illustrate a state where the sensing device 1 of FIG. 2 is rotated about a vertical axis extending in the up-down direction by 90°. In securing the sensor module 100 to the base portion 2, a heat conduction sheet 8, such as a graphite sheet, is disposed on the upper surface of the base portion 2. Furthermore, as illustrated in FIG. 3A, the lower surface of the sensor module 100 (lower surface of the support plate 10) is placed on the upper surface of the heat conduction sheet 8, and the hole portions 12 are disposed so as to be aligned with screw holes 2a formed in the base portion 2. At this time, the slits 11 formed in the support plate 10 are aligned with the elongated holes 20 of the base portion 2. While FIG. 3A illustrates a state where the pins 53 are removed, it may be a state where the pins 53 are installed to the sensor module 100, or a state where the lower ends are inserted into the sockets 33.

Furthermore, as illustrated in FIG. 3B, the sensor module 100 is secured to the base portion 2 by screwing the lower ends of the screw members 24, which are inserted into the respective hole portions 12 from the upper surface side, into the screw holes 2a. After that, the pins 53 are installed to the sensor module 100 and the lower sides of the pins 53 are inserted into the sockets 33 as described above. Accordingly, the excitation electrodes 41, 43 and the temperature detector 52 are electrically connected to the circuit board 3 side.

Then, by mounting the cover 9 from the upper surface side of the base portion 2 and the sensor module 100 and installing inside a sensing system described below, the sensing device 1 becomes a usable state.

Meanwhile, when the sensor module 100 is replaced, for example, by removing the pins 53 and subsequently removing the screw members 24, the sensor module 100 can be removed from the base portion 2. For facilitating the attaching and removing of the screw member 24, a configuration where the area of the sensor unit 5 is decreased, or through holes or cutouts are provided upward the hole portions 12 in the sensor unit 5 may be employed.

Next, the cover 9 will be described. The cover 9 is disposed to cover the peripheral area of the sensor module 100 after the sensor module 100 is mounted to the base portion 2. The cover 9 is configured as a standing cylinder with a ceiling, and a lower end portion of the cover 9 surrounds a side peripheral surface of the protrusion portion 23 of the base portion 2 and is engaged with the base portion 2. Then, a circular-shaped opening portion 61 is open at a ceiling portion of the cover 9 so as to overlap the above-described excitation electrode 41, and is configured to introduce a gas to the excitation electrode 41 on the upper surface side of the crystal resonator 4. An opening edge of the opening portion 61 is extended downward, and forms a pipe-shaped guide 62 having an opening diameter gradually decreased toward downward. A lower end of the guide 62 is slightly separated from the surface of the crystal resonator 4 by, for example, 0.5 mm.

Figure 4:
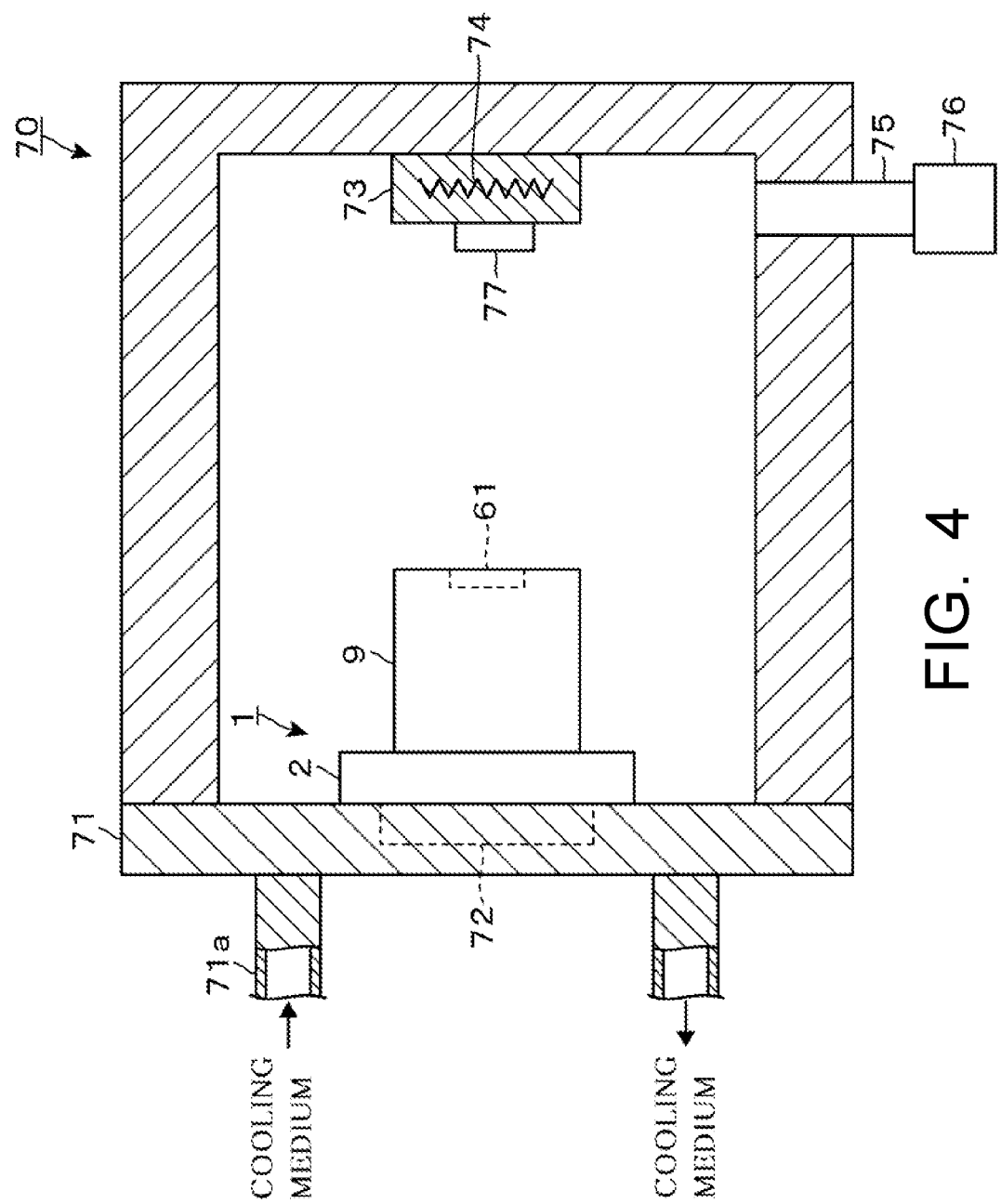
FIG. 4 is a longitudinal sectional side view of the sensing system where the sensing device is disposed.

FIG. 4 illustrates a sensing system using the sensing device 1. The sensing system includes a vacuum container 70, and the vacuum container 70 is configured to have one surface among side surfaces as the cooling unit 71 to cool the sensing device 1. Then, the sensing device 1 is installed in the vacuum container 70 as illustrated in FIG. 4 such that the base portion 2 is secured to the cooling unit 71 and the opening portion 61 faces in a horizontal direction. The cooling unit 71 includes, for example, a chiller provided with a flow passage 71a through which a coolant flows, and is configured to cool a depressed portion 72 and an opening edge portion of the depressed portion 72. Accordingly, the sensing device 1 is entirely cooled via the base portion 2. Thus, since the heat of the cooling unit 71 is conducted to the Peltier element unit 6 via the base portion 2, the base portion 2 can be said to perform heat supply and heat dissipation to the Peltier element unit 6. The base portion 2 may have a configuration to perform one of heat supply and the exhausting heat to the Peltier element unit 6.

The vacuum container 70 internally includes a pedestal portion 73 to support a specimen 77 at a position opposing the opening portion 61 of the sensing device 1, and the pedestal portion 73 is configured to be heated to a predetermined temperature by a heating mechanism 74. The vacuum container 70 is connected to a vacuum exhaust mechanism 76 via an exhaust passage 75, and configured such that the evacuation is performed to have a predetermined degree of vacuum.

When the sensing device 1 is installed to the cooling unit 71, an electrode (not illustrated) disposed to the connector described above and an electrode (not illustrated) disposed inside the depressed portion 72 are mutually connected. Accordingly, the sensing device 1 is electrically connected to a main body portion (not illustrated) of the sensing system, and becomes coolable by the cooling unit 71. Then, when the electrode of the connector described above and the electrode inside the depressed portion 72 are mutually connected, the integrated circuit 32 is electrically connected to the external main body, thereby ensuring obtaining the oscillation frequency of the crystal resonator 4 in the configuration. The Peltier element unit 6 is configured to be supplied with the current, and the temperature of the crystal resonator 4 detected by the temperature detector 52 can be obtained in the configuration. Then, based on the temperature of the crystal resonator 4 detected by the temperature detector 52, the direction of the current supplied to the Peltier element unit 6 and the supplied electricity are adjusted, thereby controlling the temperature of the crystal resonator 4. Accordingly, the temperature of the crystal resonator 4 can be increased from a predetermined temperature at a predetermined speed.

In this sensing system, after the specimen 77 is supported to the pedestal portion 73, the vacuum container 70 is closed, the evacuation is performed inside the vacuum container 70 to the predetermined vacuum, and the pedestal portion 73 is heated to, for example, 125° C. by the heating mechanism 74. Accordingly, the gas as a substance to be sensed contained in the specimen 77 is sublimated and released in the vacuum container 70. Meanwhile, a cooling medium is supplied to the cooling unit 71 and the temperature is controlled by the Peltier element unit 6, thereby cooling the crystal resonator 4 to, for example, −80° C. Accordingly, a gas generated by heating the specimen 77 enters the sensing device 1 via the opening portion 61 and adheres to the excitation electrode 41.

At this time, the oscillation frequency of the crystal resonator 4 changes due to a mass change of the crystal resonator 4, and the substance to be sensed can be detected. Furthermore, the temperature is controlled by the Peltier elements 63, 64 while obtaining the oscillation frequency, thereby increasing the temperature of the crystal resonator 4 at the speed of, for example, 1° C./minute. When the substance to be sensed attached to the excitation electrode 41 is removed due to the temperature rise of the crystal resonator 4, the oscillation frequency largely changes. A user of the sensing system can read a timing at which the oscillation frequency changes from a graph indicating the temporal change of the oscillation frequency, specify a temperature at the occurrence of the change based on the timing of the change, and further, specify a type of the substance to be sensed based on the temperature.

Features of the sensing system according to the embodiment will be described. In the sensing system according to the embodiment, the sensor unit 5, the Peltier element unit 6, and the support plate 10, which are components constituting the sensing device 1, are integrated to configure the sensor module 100, and configured to be easily attached to and removed from the base portion 2. Here, in the sensing device 1 in a conventional sensing system, the sensor unit 5 was disposed upward the Peltier element unit 6 without bonding, the sensor unit 5 was fastened to be secured to a support pillar extending from the base portion 2, thereby sandwiching the Peltier element unit 6 to bring into close contact with the sensor unit 5.

Therefore, a difference in adhesion of the Peltier element unit 6 and the sensor unit 5 was caused depending on the fastening state of the sensor unit 5 to the support pillar in assembling the sensing device 1 in some cases. The difference in adhesion caused a difference in cooling performance of the crystal resonator 4 for each sensing system in some cases.

Furthermore, in the conventional sensing system, the Peltier element unit 6 is secured to the base portion 2, for example, by a solder and the like. In such a conventional sensing system, when a failure occurred, for example, on the sensor unit 5, the Peltier element unit 6, and the like, the entire sensing device 1 needed to be replaced.

In the sensing system according to the embodiment, the sensor unit 5 and the Peltier element unit 6 are configured as a module preliminarily brought into close contact and secured. Therefore, when the individual sensing systems are assembled, the difference in adhesion of the sensor unit 5 and the Peltier element unit 6, which are components of the sensing device 1, is less likely to occur, thus decreasing the difference in cooling performance between the sensing systems.

Also when a failure occurs on the component of the sensing system, for example, the sensor unit 5, the component can be replaced per sensor module 100. Furthermore, since the sensor module 100 is secured by the screw members 24, the sensor module 100 is easily attached to and removed from the base portion 2, thus facilitating the replacement.

The above-described sensing system includes the sensor module 100 where the sensor unit 5 and the Peltier element unit 6 are integrated with the support plate 10. Therefore, the variation in cooling and heating performance for each sensing device 1 due to an installation error in assembling the sensor unit 5 and the Peltier element unit 6 can be suppressed. Since the support plate 10 is configured to be removable from the base portion 2, the support plate 10 can be attached and removed per sensor module 100 when a failure occurs on the sensor module 100, thus facilitating the replacement.

When the sensor module 100 is installed, the sensor unit 5 needs to be electrically connected to the circuit board 3. In the above-described embodiment, the pin 53 as a conductive member is used, and the pin 53 is inserted through the socket 33 to be mechanically connected, thereby electrically connecting the sensor unit 5 to the circuit board 3. Therefore, when the sensor module 100 is installed. The electrical connection between the sensor unit 5 and the circuit board 3 is facilitated.

In the case of the structure where the peripheral edge of the sensor unit 5 is secured to the support pillar, a distorting force is generated to the substrate 50 of the sensor unit 5 in some cases due to a difference between forces for fastening to the respective support pillars by the screw members, thus possibly damaging the substrate 50. In this embodiment, since the center of the lower surface of the sensor unit 5 is held by the Peltier element unit 6, the distortion of the substrate 50 can be suppressed.

The sensor module 100 according to the embodiment may include a heater circuit as a heating unit that heats the substrate and is embedded in the substrate 50 of the sensor unit 5. At this time, by making a difference between a heating temperature range of the substrate by the heater circuit and a temperature control range of the Peltier element unit 6 as a temperature control mechanism, a temperature zone for heating and cooling the crystal resonator can be expanded compared with the configuration where only the Peltier element unit 6 is disposed. For example, as a sensing system where a temperature of a piezoelectric resonator is changed to cause adsorption and desorption of the substance to be sensed to the piezoelectric resonator, thereby sensing the substance to be sensed, a CQCM that uses a liquid nitrogen as a cooling medium has been known. While the CQCM is used in a temperature zone different from that of the TQCM described in the embodiment, the sensor module 100 can be used in common between the TQCM and the CQCM by expanding an operating temperature zone of the sensor module 100.

In the sensor module 100 according to the embodiment, the cavities 50a, 10a corresponding to the upper surface and the lower surface of the Peltier element unit 6 are formed in the sensor unit 5 and the support plate 10, respectively. Therefore, the connection portion of the sensor unit 5 and the Peltier element unit 6 and the connection portion of the Peltier element unit 6 and the support plate 10 constantly provide the connection at the same positions. Accordingly, the error in the heating and cooling performance of the sensing device 1 caused by a position shift of the Peltier element unit 6 and the base portion 2 with respect to the crystal resonator 4 can be suppressed.

Furthermore, in the above-described embodiment, the metal nanoparticle paste 90 is used for connecting the sensor unit 5 to the Peltier element unit 6. Therefore, the heat conductivity between the sensor unit 5 and the Peltier element unit 6 is increased. By using the metal nanoparticle paste 90 also for connecting the Peltier element unit 6 to the support plate 10, the heat conductivity between the Peltier element unit 6 and the support plate 10 can be similarly increased.

Since the base portion 2 is contacted to the cooling unit 71 to be cooled, thereby cooling the crystal resonator 4 in the sensing system according to the embodiment, the heat conduction sheet 8 is preferably disposed between the support plate 10 and the base portion 2 to increase the heat conductivity between the base portion 2 and the sensor module 100. The heating unit to heat the sensing device 1 may be disposed instead of the cooling unit 71. Alternatively, a configuration that ensures both heating and cooling of the base portion 2 may be employed.

The embodiment disclosed herein is to be considered in all respects as illustrative and not restrictive. The above-described embodiment may be omitted, replaced, and changed in various manners without departing from the accompanying claims and the gist. For example, only one Peltier element may be disposed, or the Peltier elements may be disposed in multiple stages of three or more stages. To enhance the detection accuracy for the crystal resonator 4, a reaction electrode to which the substance to be sensed attaches and a reference electrode to which the substance to be sensed does not attach may be disposed. Then, a configuration where oscillation frequencies F1, F2 of the respective electrodes can be obtained may be employed to detect the substance to be sensed based on a difference value between the oscillation frequencies F1, F2.

What is claimed is:

1. A sensing device that adsorbs a substance to be sensed as a gas to a piezoelectric resonator, changes a temperature of the piezoelectric resonator to desorb the substance to be sensed, and senses the substance to be sensed based on a relationship between a change of an oscillation frequency of the piezoelectric resonator and the temperature, the sensing device comprising:
    a substrate that holds the piezoelectric resonator;
    a thermoelectric element unit, disposed at a position in contact with the substrate to change the temperature of the piezoelectric resonator;
    a support plate that supports the thermoelectric element unit from an opposite side of the position in contact with the substrate; and
    a base portion to which the support plate is secured such that a surface on an opposite side of the surface to support the thermoelectric element unit is in contact with the base portion, the base portion performing at least one of heat supply and heat dissipation to the thermoelectric element unit via the support plate,
    wherein the substrate, the thermoelectric element unit, and the support plate are integrated to form a sensing module unit removable from the base portion.

2. The sensing device according to claim 1, wherein the base portion includes a housing space that houses an oscillator circuit to oscillate the piezoelectric resonator.

3. The sensing device according to claim 2, further comprising:
    a conductive member, removably disposed between an electrode connected to the piezoelectric resonator and an electrode connected to the oscillator circuit, and
    the conductive member switching electrical connection and disconnection between the piezoelectric resonator and the oscillator circuit.

4. The sensing device according to claim 1, wherein the base portion is connected to a cooling/heating unit that performs at least one of cooling and heating of the base portion.

5. The sensing device according to claim 1, wherein the substrate and the thermoelectric element unit are mutually connected via metal nanoparticles, and the thermoelectric element unit and the support plate are mutually connected via the metal nanoparticles.

6. The sensing device according to claim 1, further comprising:
a heat conduction sheet, disposed between the base portion and the support plate.

7. The sensing device according to claim 1, wherein
a connection portion of the substrate and the thermoelectric element unit and a connection portion of the thermoelectric element unit and the support plate each have a fitting structure where one is fitted to the other to perform a positioning.

8. The sensing device according to claim 1, wherein
the thermoelectric element unit is connected to a center on one surface side of the substrate.

9. The sensing device according to claim 1, wherein
the thermoelectric element unit is disposed at a position in contact with the substrate at a position opposing the piezoelectric resonator via the substrate.

10. The sensing device according to claim 1, wherein the thermoelectric element unit includes:
a heating unit, embedded in the substrate; and
a temperature control mechanism, disposed so as to be in contact with the substrate,
wherein the temperature control mechanism having a temperature control range different from a heating temperature range of the substrate by the heating unit.

* * * * *